(12) United States Patent
Sonoda et al.

(10) Patent No.: US 12,219,797 B2
(45) Date of Patent: Feb. 4, 2025

(54) DISPLAY DEVICE INCLUDING A FRAME-LIKE SHAPE OXIDE SEMICONDUCTOR LAYER

(71) Applicant: SHARP KABUSHIKI KAISHA, Sakai (JP)

(72) Inventors: Tohru Sonoda, Sakai (JP); Takashi Ochi, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 609 days.

(21) Appl. No.: 17/442,567

(22) PCT Filed: Mar. 26, 2019

(86) PCT No.: PCT/JP2019/012940
§ 371 (c)(1),
(2) Date: Sep. 23, 2021

(87) PCT Pub. No.: WO2020/194526
PCT Pub. Date: Oct. 1, 2020

(65) Prior Publication Data
US 2022/0190291 A1    Jun. 16, 2022

(51) Int. Cl.
*H10K 50/84*     (2023.01)
*H10K 50/844*    (2023.01)
(Continued)

(52) U.S. Cl.
CPC ......... *H10K 50/844* (2023.02); *H10K 59/121* (2023.02); *H10K 59/65* (2023.02);
(Continued)

(58) Field of Classification Search
CPC ...... H10K 50/844; H10K 50/15; H10K 50/16; H10K 50/17; H10K 50/171; H10K 59/121;
(Continued)

(56) References Cited

U.S. PATENT DOCUMENTS 10,818,874 B2 * 10/2020 Park ..................... H10K 50/15
10,903,293 B2 *  1/2021 Jeong .................. H10K 59/124
(Continued)

FOREIGN PATENT DOCUMENTS

CN     107808896 A   *  3/2018    ......... H01L 27/3244
EP     3206231 A1    *  8/2017    ............. G04B 19/04
(Continued)

*Primary Examiner* — Ida M Soward
(74) *Attorney, Agent, or Firm* — ScienBiziP, P.C.

(57) ABSTRACT

An aspect of the disclosure, in a non-display region, an oxide semiconductor layer is provided in a frame-like shape along a peripheral edge of a through hole, a first opening is provided in a first inorganic insulating film so as to surround the through hole in a plan view and expose the oxide semiconductor layer in the non-display region, a common functional layer is provided so as to extend from a display region to the non-display region, a second opening is provided in a frame-like shape so as to surround the through hole in a plan view and expose the oxide semiconductor layer in the common functional layer, and a second inorganic insulating film is in contact with the oxide semiconductor layer via the second opening.

17 Claims, 11 Drawing Sheets

(51) Int. Cl.
*H10K 59/12* (2023.01)
*H10K 59/121* (2023.01)
*H10K 59/65* (2023.01)
*H10K 71/00* (2023.01)
*H10K 77/10* (2023.01)
*H10K 50/15* (2023.01)
*H10K 50/16* (2023.01)
*H10K 50/17* (2023.01)
*H10K 102/00* (2023.01)

(52) U.S. Cl.
CPC ........... *H10K 71/00* (2023.02); *H10K 77/111* (2023.02); *H10K 50/15* (2023.02); *H10K 50/16* (2023.02); *H10K 50/17* (2023.02); *H10K 50/171* (2023.02); *H10K 59/12* (2023.02); *H10K 59/1201* (2023.02); *H10K 59/1216* (2023.02); *H10K 2102/311* (2023.02)

(58) Field of Classification Search
CPC .... H10K 59/65; H10K 59/122; H10K 59/124; H10K 59/12; H10K 59/1216; H10K 77/111; H10K 2102/311; G09F 9/00; G09F 9/30; H05B 33/04
See application file for complete search history.

(56) References Cited

U.S. PATENT DOCUMENTS

| | | | |
|---|---|---|---|
| 2017/0110532 A1* | 4/2017 | Kim | H10K 59/12 |
| 2017/0237038 A1* | 8/2017 | Kim | H10K 77/10 |
| | | | 257/40 |
| 2018/0108863 A1* | 4/2018 | Kajiyama | H10K 59/131 |
| 2018/0342700 A1* | 11/2018 | Cai | H10K 50/8445 |
| 2019/0051859 A1 | 2/2019 | Choi et al. | |
| 2024/0065023 A1* | 2/2024 | Kanaya | H10K 50/84 |

FOREIGN PATENT DOCUMENTS

| | | | | |
|---|---|---|---|---|
| JP | 2019-035950 A | | 3/2019 | |
| WO | WO-2019031024 A1 * | | 2/2019 | ........... G06F 3/0393 |

* cited by examiner

DISPLAY DEVICE INCLUDING A FRAME-LIKE SHAPE OXIDE SEMICONDUCTOR LAYER

TECHNICAL FIELD

The disclosure relates to a display device and a method for manufacturing the same.

BACKGROUND ART

In recent years, a self-luminous type organic electroluminescence (hereinafter also referred to as EL) display device using an organic EL element has attracted attention as a display device that can replace liquid crystal display devices. For this organic EL display device, there has been proposed a structure in which in order to install an electronic component such as a camera or a fingerprint sensor, for example, a non-display region having an island shape is provided inside a display region in which an image is displayed and a through hole penetrating in the thickness direction is provided in the non-display region.

For example, PTL 1 discloses an electronic device including a display panel in which a module hole penetrating through a front face and a back face of a base substrate is provided in a display region, and an electronic module housed in the module hole.

CITATION LIST

Patent Literature

PTL 1: JP 2019-35950 A

SUMMARY

Technical Problem

The organic EL element includes, for example, a first electrode, an organic EL layer, and a second electrode, which are layered in this order over a substrate. Here, a common functional layer that constitutes the organic EL layer and the second electrode are formed by a vapor deposition using a vapor deposition mask so as to be common to a plurality of subpixels constituting the display region. Thus, when a non-display region having an island shape is disposed inside the display region, it is technically difficult to shield the non-display region with the vapor deposition mask, and thus the common functional layer and the second electrode are also formed in the non-display region. Then, for example, an optical transmittance of the common functional layer reduces performance of the electronic component, and thus the common functional layer formed in the non-display region needs to be removed. Here, in order to remove the common functional layer formed in the non-display region, for example, it is conceived that a metal layer capable of converting light to heat is provided in the non-display region and the metal layer is irradiated with laser light to sublimate the common functional layer. However, the organic EL layer (functional layer) in the display region may be damaged due to stray light of reflected light of the laser light.

The disclosure has been made in view of the above, and an object of the disclosure is to remove a common functional layer of a non-display region while suppressing damage to a functional layer in a display region.

Solution to Problem

To achieve the object described above, a display device according to the disclosure includes: a resin substrate; a thin film transistor layer provided on the resin substrate and including a first inorganic insulating film; a light-emitting element layer provided on the thin film transistor layer and including a plurality of light-emitting elements arranged corresponding to a plurality of subpixels constituting a display region; and a sealing film provided on the light-emitting element layer to cover the light-emitting elements and including a second inorganic insulating film, a frame region being provided around the display region, a non-display region being provided in an island shape within the display region, a through hole penetrating in a thickness direction of the resin substrate being provided in the non-display region, a first electrode, a functional layer, and a second electrode being sequentially layered on each of the light-emitting elements, and the functional layer including a common functional layer provided in common to the plurality of subpixels, wherein an oxide semiconductor layer is provided in a frame-like shape along a peripheral edge of the through hole in the non-display region, a first opening is provided in the first inorganic insulating film to surround the through hole in a plan view and expose the oxide semiconductor layer in the non-display region, the common functional layer is provided to extend from the display region to the non-display region, a second opening is provided in a frame-like shape to surround the through hole in a plan view and expose the oxide semiconductor layer in the common functional layer, and the second inorganic insulating film is in contact with the oxide semiconductor layer via the second opening.

A method for manufacturing a display device according to the disclosure includes: a thin film transistor layer forming step of forming a thin film transistor layer including a first inorganic insulating film on a resin substrate; a light-emitting element layer forming step of forming a light-emitting element layer on the thin film transistor layer, the light-emitting element layer including a plurality of light-emitting elements arranged corresponding to a plurality of subpixels constituting a display region; and a sealing film forming step of forming a sealing film including a second inorganic insulating film on the light-emitting element layer to cover the light-emitting elements, wherein a frame region is provided around the display region, a non-display region is provided in an island shape inside the display region, a through hole penetrating in a thickness direction of the resin substrate in the non-display region, a first electrode, a functional layer, and a second electrode are sequentially layered on the light-emitting elements, and the functional layer includes a common functional layer provided in common to the plurality of subpixels, the thin film transistor layer forming step includes a semiconductor layer forming step of forming an oxide semiconductor layer in an island shape in the non-display region, and a first opening forming step of forming a first opening to expose the oxide semiconductor layer to the first inorganic insulating film in the non-display region, the light-emitting element layer forming step includes a functional layer forming step of forming the common functional layer to cover the oxide semiconductor layer exposed from the first opening and extend from the display region to the non-display region, and a functional layer removal step of removing the common functional layer of a portion covering the oxide semiconductor layer by irradiating the oxide semiconductor layer with laser light, and forming a second opening in the common functional layer to expose the oxide semiconductor layer, a peripheral end of the second opening being surrounded by a peripheral end of the first opening in a plan view, in the sealing film forming step, the second inorganic insulating film is formed to cover the oxide semiconductor layer exposed from the second opening, and the method includes, after the sealing film forming step, a through hole forming step of forming the through hole in the non-display region to be surrounded by the peripheral end of the second opening in a plan view.

Advantageous Effects of Disclosure

According to the disclosure, in the non-display region, the oxide semiconductor layer is provided in a frame-like shape along the peripheral edge of the through hole, and in the first inorganic insulating film, the first opening is provided in the non-display region so as to surround the through hole in a plan view and expose the oxide semiconductor layer, so that it is possible to remove the common functional layer in the non-display region while suppressing damage to the functional layer of the display region.

DESCRIPTION OF EMBODIMENTS

Embodiments of the disclosure will be described below in detail with reference to the drawings. Note that the disclosure is not limited to each embodiment to be described below.

First Embodiment

Figure 1:
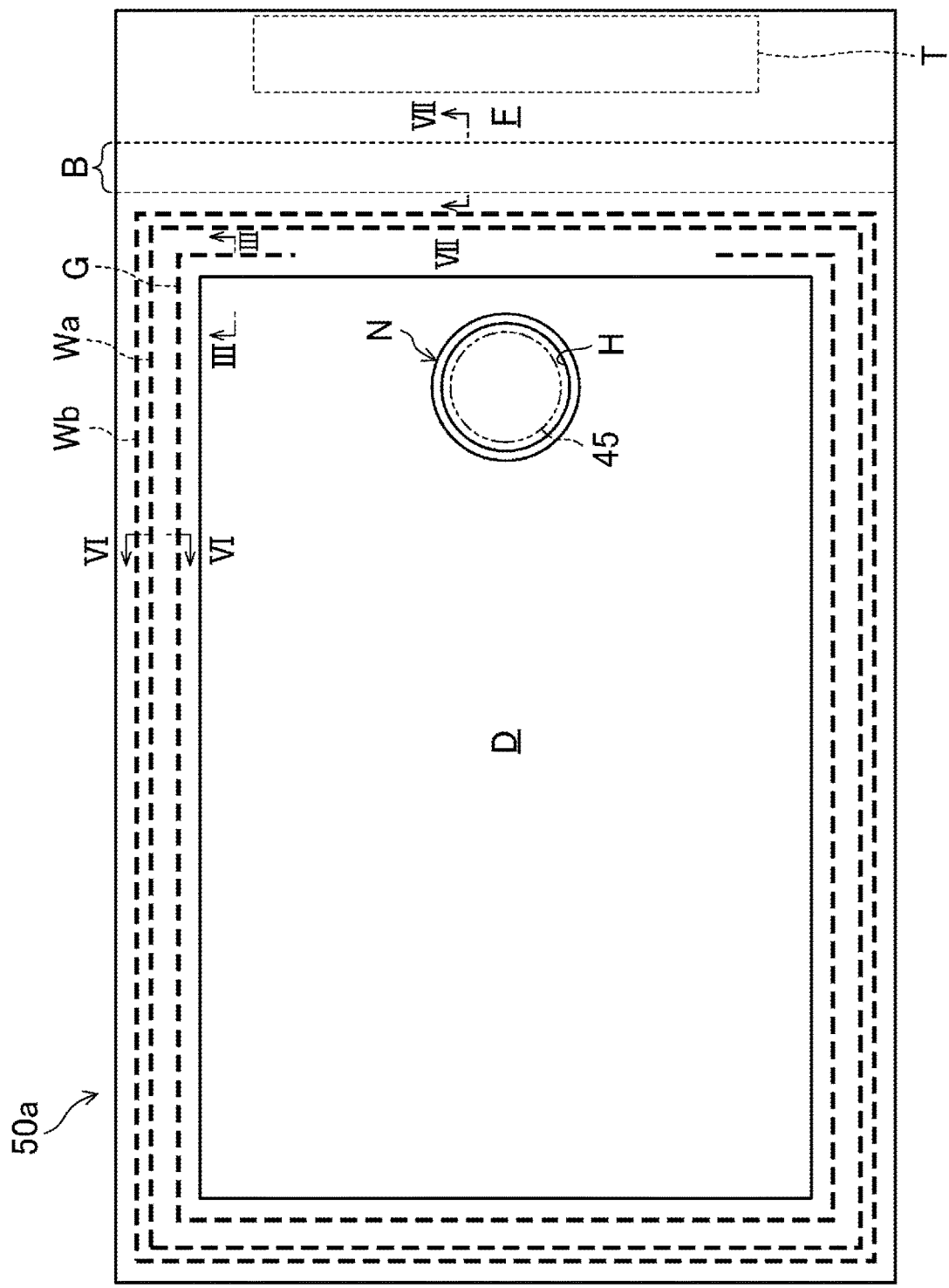
FIG. 1 is a plan view illustrating a schematic configuration of an organic EL display device according to a first embodiment of the disclosure.
Figure 2:
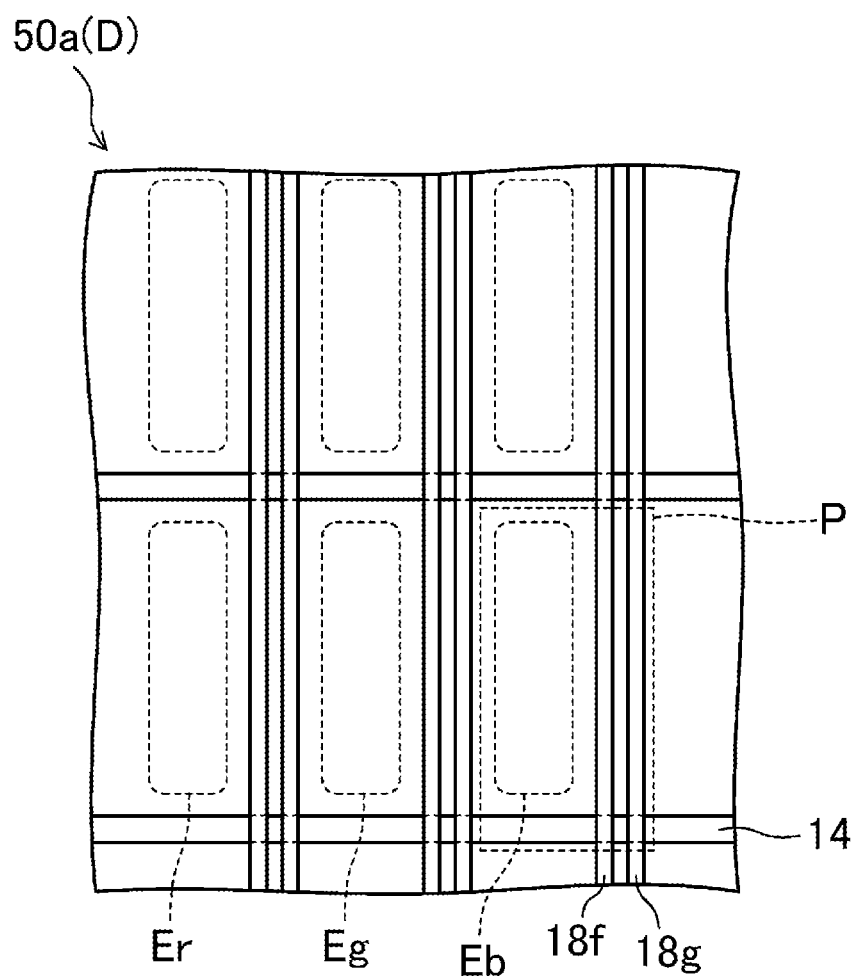
FIG. 2 is a plan view of a display region of the organic EL display device according to the first embodiment of the disclosure.
Figure 3:
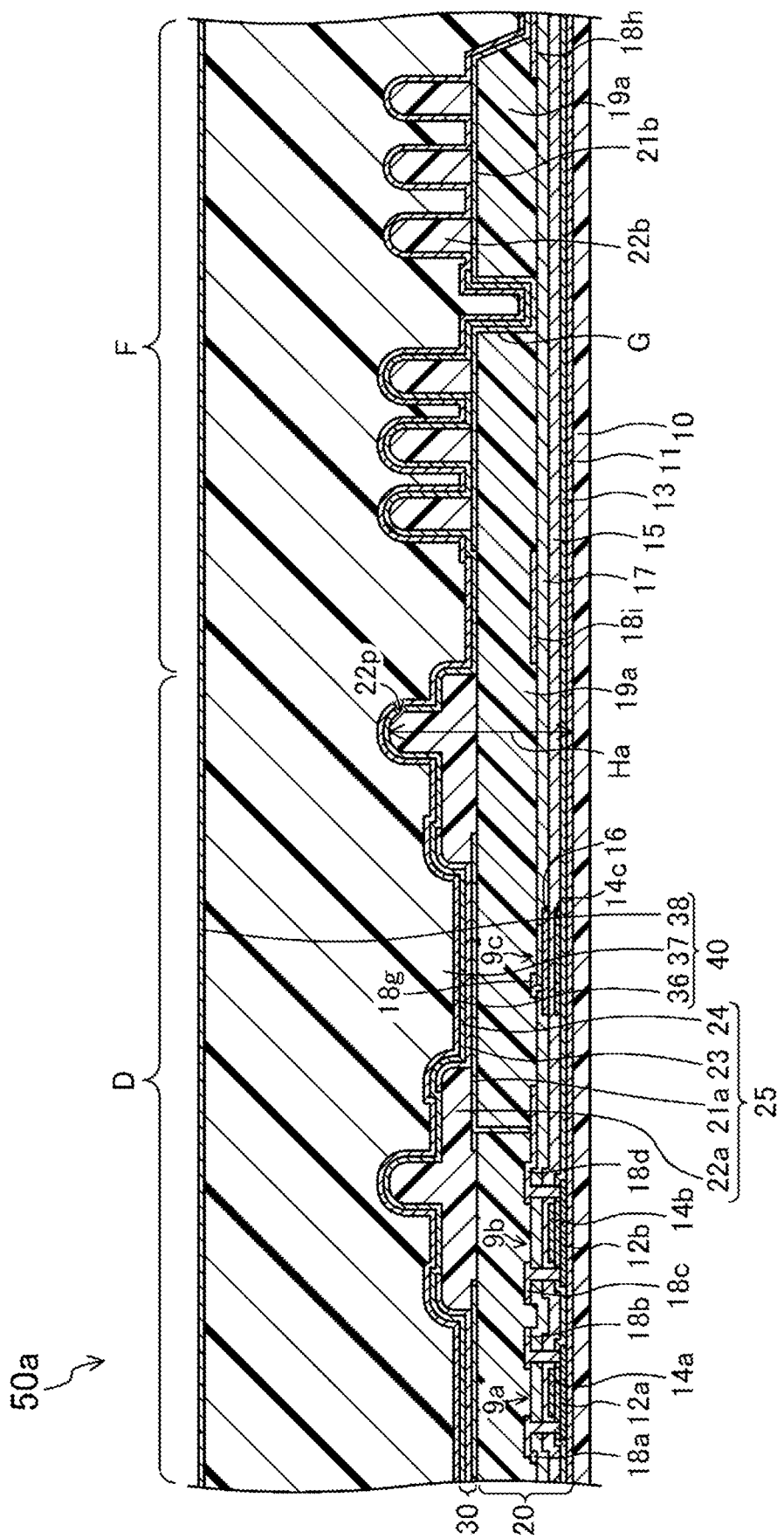
FIG. 3 is a cross-sectional view of the organic EL display device taken along a line III-III in FIG. 1.
Figure 4:
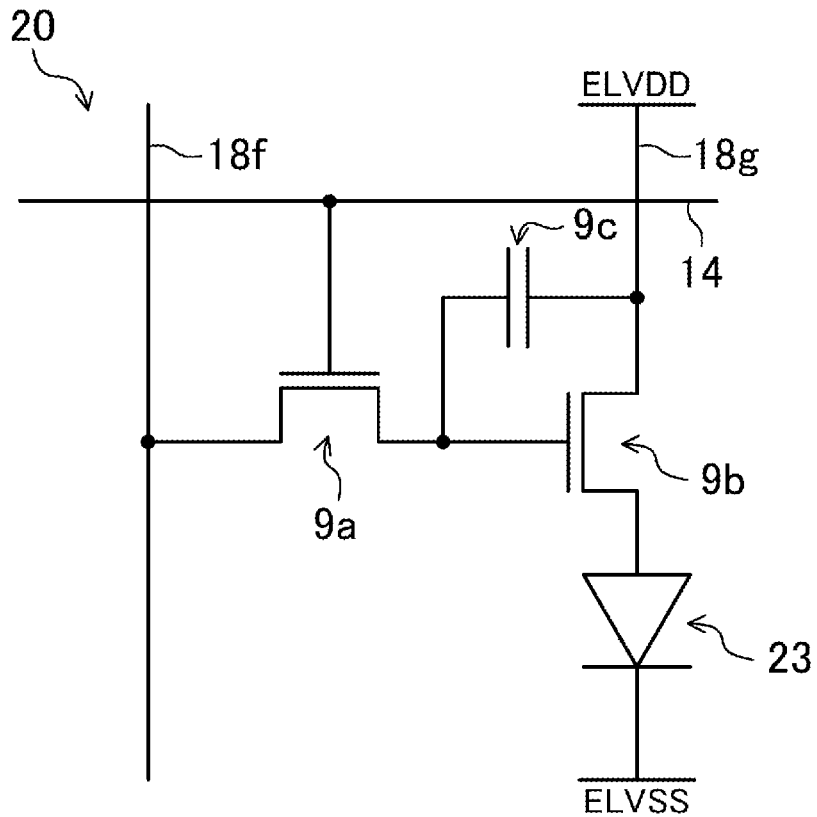
FIG. 4 is an equivalent circuit diagram of a thin film transistor layer constituting the organic EL display device according to the first embodiment of the disclosure.
Figure 5:
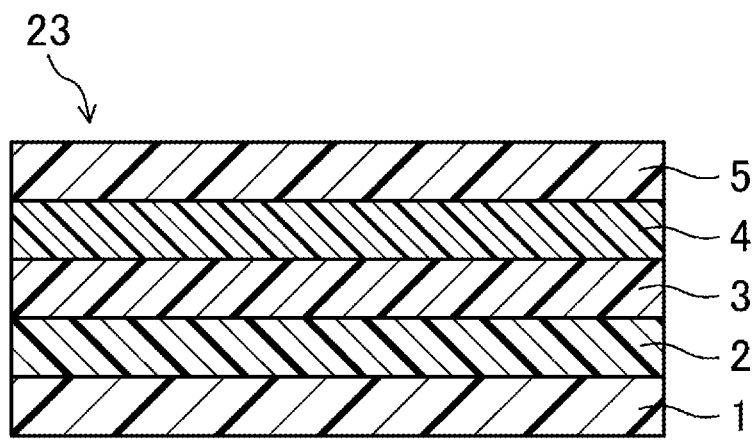
FIG. 5 is a cross-sectional view of an organic EL layer constituting the organic EL display device according to the first embodiment of the disclosure.
Figure 6:
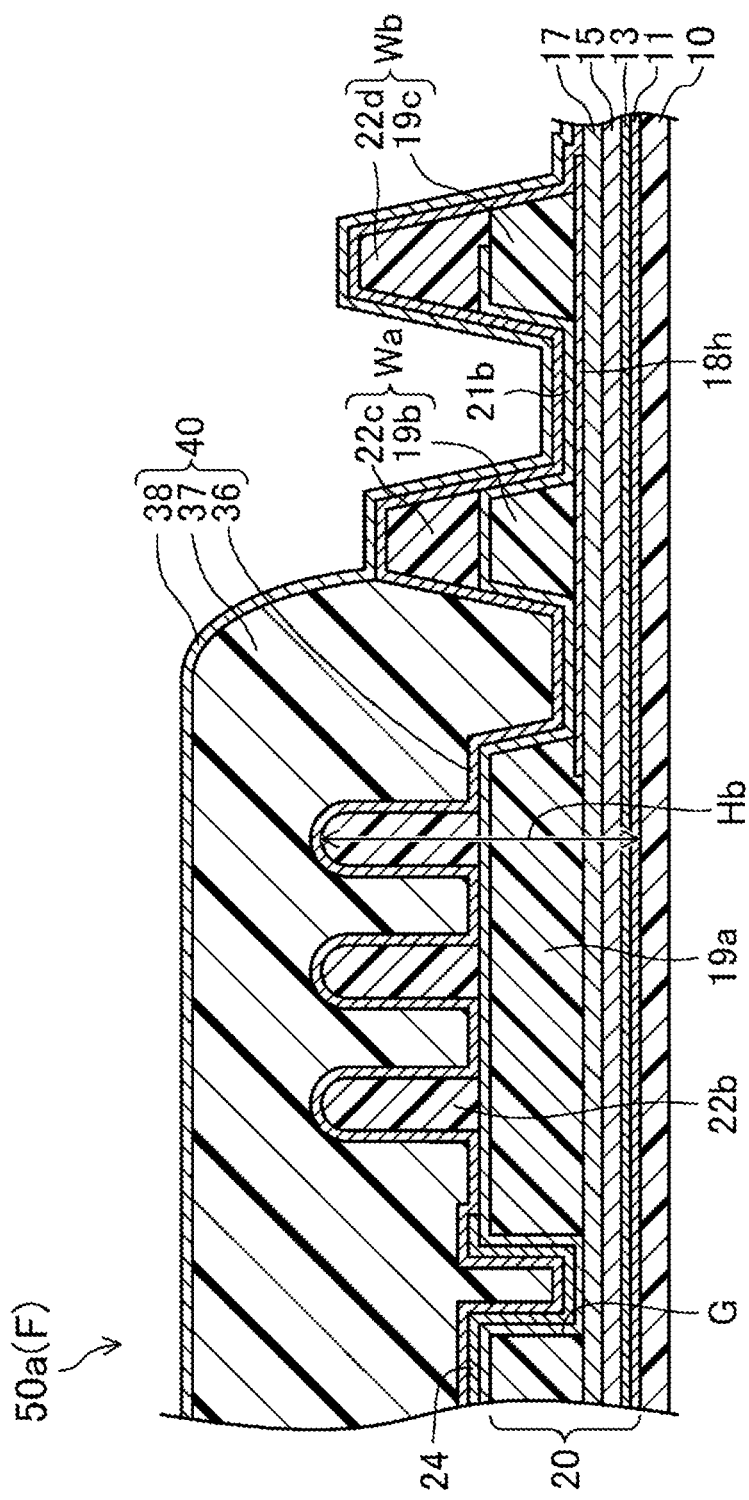
FIG. 6 is a cross-sectional view of a frame region of the organic EL display device taken along a line VI-VI in FIG. 1.
Figure 7:
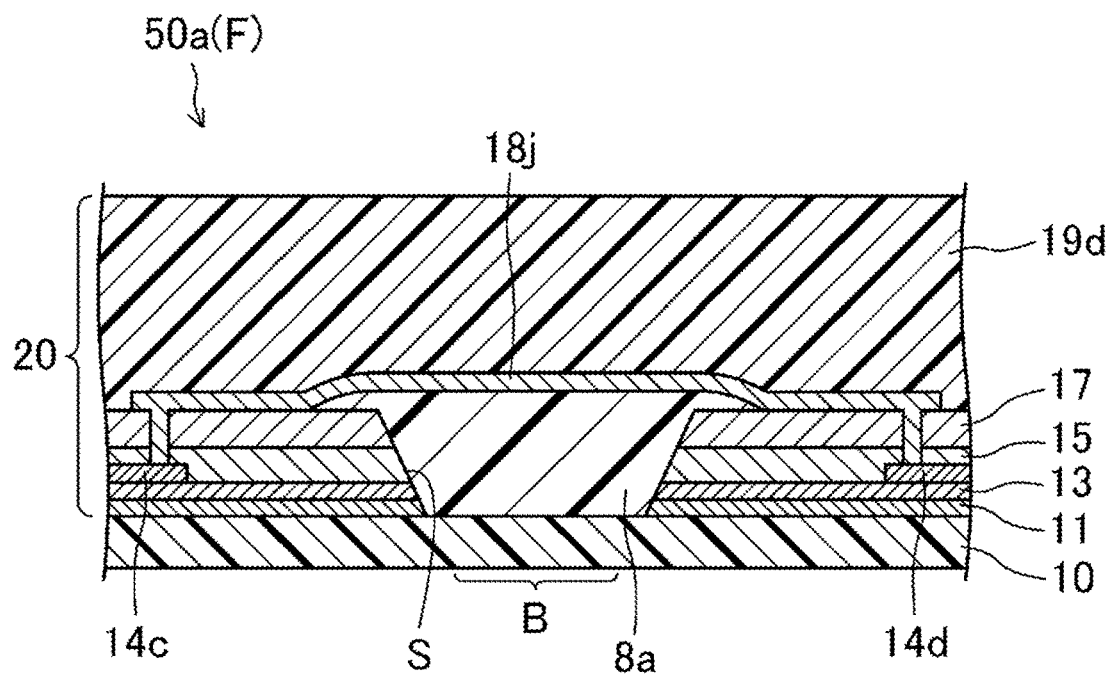
FIG. 7 is a cross-sectional view of a frame region of the organic EL display device taken along a line VII-VII in FIG. 1.
Figure 8:
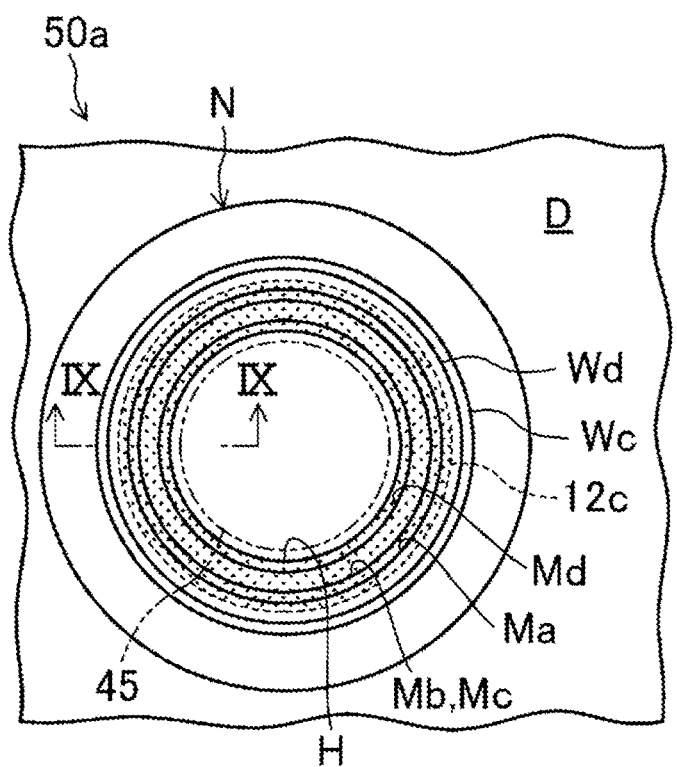
FIG. 8 is a plan view of a non-display region and a periphery of the non-display region of the organic EL display device according to the first embodiment of the disclosure.
Figure 9:
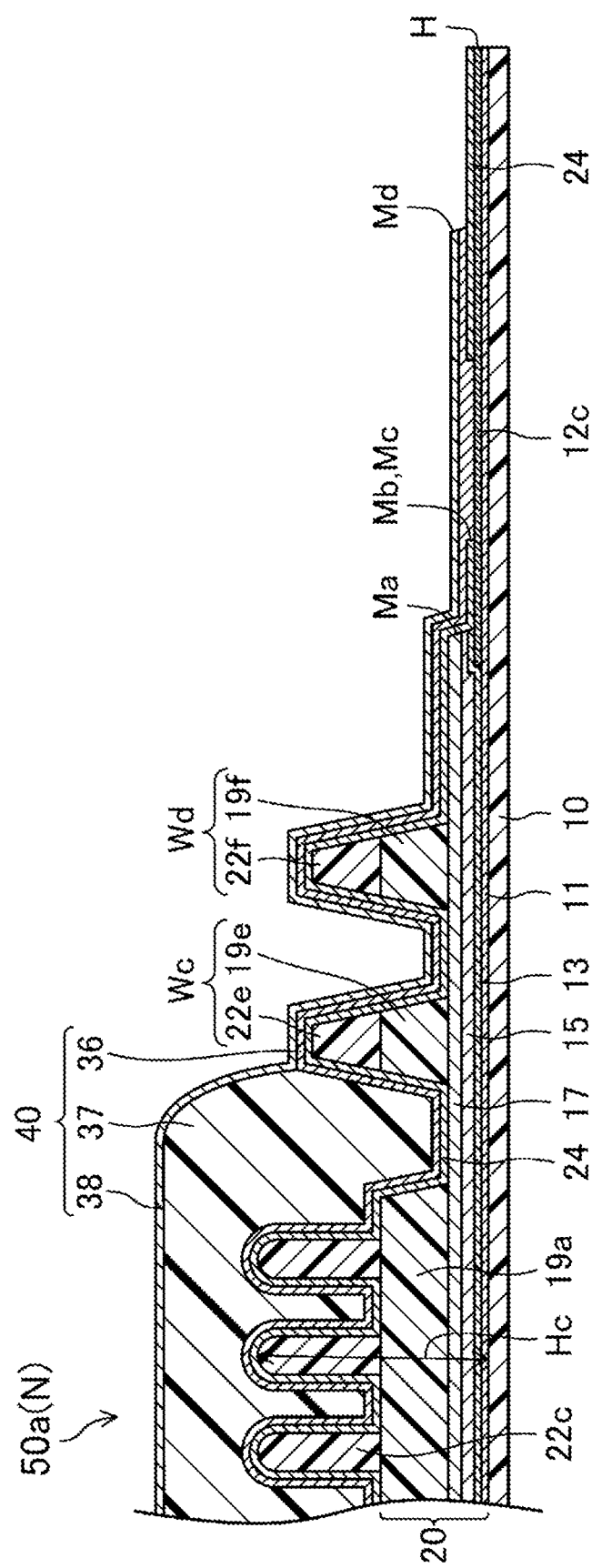
FIG. 9 is a cross-sectional view of the non-display region of the organic EL display device taken along a line IX-IX in FIG. 8.

FIG. 1 to FIG. 12 illustrate a first embodiment of a display device and a method for manufacturing the same according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. Further, FIG. 2 is a plan view of a display region D of the organic EL display device 50a. FIG. 3 is a cross-sectional view of the organic EL display device 50a taken along a line III-III in FIG. 1. FIG. 4 is an equivalent circuit diagram of a thin film transistor layer 20 constituting the organic EL display device 50a. Further, FIG. 5 is a cross-sectional view of an organic EL layer 23 constituting the organic EL display device 50a. FIG. 6 and FIG. 7 are cross-sectional views of a frame region F of the organic EL display device 50a taken along a line VI-VI and line VII-VII, respectively, in FIG. 1. Further, FIG. 8 is a plan view of a non-display region N and a periphery of the non-display region N of the organic EL display device 50a. Further, FIG. 9 is a cross-sectional view of the non-display region N of the organic EL display device 50a taken along a line IX-IX in FIG. 8.

As illustrated in FIG. 1, the organic EL display device 50a includes, for example, the display region D provided in a rectangular shape and configured to display an image, and the frame region F provided in a frame shape surrounding the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D. Further, as illustrated in FIG. 1, the non-display region N is provided in an island shape in the display region D. Here, as illustrated in FIG. 1, in order to dispose a camera 45, a through hole H penetrating in the thickness direction of a resin substrate layer 10, which will be described below, is provided in the non-display region N. Note that a detailed structure and the like of the non-display region N will be described below with reference to FIG. 8 and FIG. 9.

A terminal portion T is provided in an end portion of the frame region F on the right side in FIG. 1 in such a manner as to extend in one direction (a vertical direction in the drawing). Additionally, as illustrated in FIG. 1, in the frame region F, a bending portion B bendable, for example, by 180 degrees (in a U-shape) about a bending axis that is the vertical direction in the drawing is provided on the display region D side of the terminal portion T in such a manner as to extend in one direction (the vertical direction in the drawing). Here, as illustrated in FIG. 1, FIG. 3, and FIG. 6, in the frame region F, a trench G having a substantially C shape is provided in a flattening film 19a, which will be described below, in such a manner as to penetrate the flattening film 19a. Note that as illustrated in FIG. 1, the trench G is provided in a substantially C shape in such a manner as to open on the terminal portion T side in a plan view.

As illustrated in FIG. 3, FIG. 6, FIG. 7, and FIG. 9, the organic EL display device 50a includes a resin substrate layer 10 provided as a resin substrate, a thin film transistor (hereinafter also referred to as TFT) layer 20 provided on the resin substrate layer 10, an organic EL element layer 30 provided on the TFT layer 20, and a sealing film 40 provided on the organic EL element layer 30.

The resin substrate layer 10 is formed, for example, of a polyimide resin or the like.

As illustrated in FIG. 3, FIG. 6, FIG. 7, and FIG. 9, the TFT layer 20 includes a gate insulating film 13, a first interlayer insulating film 15, and a second interlayer insulating film 17 sequentially provided as first inorganic insulating films on the resin substrate layer 10, and the flattening film 19a provided on the second interlayer insulating film 17. Specifically, as illustrated in FIG. 3, the TFT layer 20 includes a base coat film 11 provided on the resin substrate layer 10 side, a plurality of first TFTs 9a, a plurality of second TFTs 9b, and a plurality of capacitors 9c provided on the base coat film 11, and the flattening film 19a provided on the first TFTs 9a, the second TFTs 9b, and the capacitors 9c. Here, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in the vertical direction in the drawings. Further, in the TFT layer 20, as illustrated in FIG. 2 and FIG. 4, a plurality of power source lines 18g are provided so as to extend parallel to each other in the vertical direction in the drawings. Then, as illustrated in FIG. 2, each of the power source lines 18g is provided to be adjacent to each of the source lines 18f. Further, in the TFT layer 20, as illustrated in FIG. 4, each of the subpixels P includes the first TFT 9a, the second TFT 9b, and the capacitor 9c.

The base coat film 11, the gate insulating film 13, the first interlayer insulating film 15, and the second interlayer insulating film 17 are each constituted of a single-layer film or a layered film of an inorganic insulating film of, for example, silicon nitride, silicon oxide, or silicon oxynitride.

The first TFT 9a is electrically connected to the corresponding gate line 14 and source line 18f in each of the subpixels P, as illustrated in FIG. 4. Additionally, as illustrated in FIG. 3, the first TFT 9a includes a semiconductor layer 12a, a gate insulating film 13, a gate electrode 14a, the first interlayer insulating film 15, the second interlayer insulating film 17, and a source electrode 18a and a drain electrode 18b, which are sequentially provided on the base coat film 11. Here, the semiconductor layer 12a includes, for example, an In—Ga—Zn—O-based semiconductor such as InGaZnO$_4$, is provided in an island shape on the base coat film 11 as illustrated in FIG. 3, and includes a channel region, a source region, and a drain region. Additionally, as illustrated in FIG. 3, the gate insulating film 13 is provided so as to cover the semiconductor layer 12a. Additionally, as illustrated in FIG. 3, the gate electrode 14a is provided on the gate insulating film 13, and overlaps with the channel region of the semiconductor layer 12a. Additionally, as illustrated in FIG. 3, the first interlayer insulating film 15 and the second interlayer insulating film 17 are sequentially provided so as to cover the gate electrode 14a. Additionally, as illustrated in FIG. 3, the source electrode 18a and the drain electrode 18b are provided being separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that, in the present embodiment, as a transparent amorphous oxide semiconductor (TaOS) constituting the semiconductor layer 12a, an In—Ga—Zn—O-based semiconductor has been exemplified, but another semiconductor such as In—Sn—Zn—O-based, In—Al—Zn—O-based, In—Al—Sn—Zn—O-based, Zn—O-based, In—Zn—O-based, Zn—Ti—O-based, Cd—Ge—O-based, Cd—Pb—O-based, Cd—Zn—O-based, Cd—O-based, Mg—Zn—O-based, In—Ga—Sn—O-based, In—Ga—O-based, Zr—In—Zn—O-based, Hf—In—Zn—O-based, Al—Ga—Zn—O-based, Ga—Zn—O-based, or In—Ga—Zn—O-based semiconductor may be included. Specific examples of the In—Sn—Zn—O-based semiconductor include In$_2$O$_3$—SnO$_2$—ZnO and the like. In addition, examples of the In—Ga—Zn—O-based semiconductor include InGaO$_3$(ZnO)$_5$ and the like. As the Zn—O-based semiconductor, a semiconductor of ZnO in an amorphous state, a polycrystalline state, or a microcrystalline state in which the amorphous state and the polycrystalline state are mixed, the ZnO to which an impurity element of at least one kind selected from Group 1 elements, Group 13 elements, Group 14 elements, Group 15 elements, Group 17 elements, and the like is added or no impurity is added, can be used.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are sequentially provided on the base coat film 11. Here, the semiconductor layer 12b includes, for example, an In—Ga—Zn—O-based semiconductor such as InGaZnO$_4$, as illustrated in FIG. 3, is provided in an island shape on the base coat film 11, and includes a channel region, a source region, and a drain region. Additionally, as illustrated in FIG. 3, the gate insulating film 13 is provided so as to cover the semiconductor layer 12b. Additionally, as illustrated in FIG. 3, the gate electrode 14b is provided on the gate insulating film 13, and overlaps with the channel region of the semiconductor layer 12b. Additionally, as illustrated in FIG. 3, the first interlayer insulating film 15 and the second interlayer insulating film 17 are sequentially provided so as to cover the gate electrode 14b. Additionally, as illustrated in FIG. 3, the source electrode 18c and the drain electrode 18d are provided being separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as those of the gate electrodes 14a and 14b, the first interlayer insulating film 15 provided so as to cover the lower conductive layer 14c, and an upper conductive layer 16 provided on the first interlayer insulating film 15 so as to overlap with the lower conductive layer 14c. Note that, as illustrated in FIG. 3, the upper conductive layer 16 is electrically connected to the power source line 18g via a contact hole formed in the second interlayer insulating film 17.

The flattening film 19a is formed of, for example, a positive-working photosensitive resin such as a polyimide resin.

As illustrated in FIG. 3, the organic EL element layer 30 includes a plurality of organic EL elements 25 arranged in a matrix shape on the flattening film 19a. Here, the plurality of organic EL elements 25 are provided as a plurality of light-emitting elements arranged corresponding to the plurality of subpixels P.

As illustrated in FIG. 3, the organic EL element 25 includes a first electrode 21a, an organic EL layer 23, and a second electrode 24 sequentially layered on the TFT layer 20. Specifically, as illustrated in FIG. 3, the organic EL element 25 includes the first electrode 21a provided on the flattening film 19a of the TFT layer 20, the organic EL layer 23 provided on the first electrode 21a as a functional layer, and the second electrode 24 provided on the organic EL layer 23 to be common to the plurality of subpixels P.

As illustrated in FIG. 3, the first electrode 21a is electrically connected to the drain electrode 18d of the second TFT 9b of each of the subpixels P via a contact hole formed in the flattening film 19a. The first electrode 21a functions to inject holes (positive holes) into the organic EL layer 23. The first electrode 21a is preferably formed of a material having a large work function to improve the hole injection efficiency into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a may include an alloy with astatine (At)/astatine oxide (AtO$_2$). Examples of materials constituting the first electrode 21a may include electrically conductive oxides such as tin oxide (SnO), zinc oxide (ZnO), indium tin oxide (ITO), and indium zinc oxide (IZO). The first electrode 21a may be formed by layering a plurality of layers formed of any of the materials described above. Note that, examples of compound materials having a large work function include indium tin oxide (ITO) and indium zinc oxide (IZO). Furthermore, a peripheral end portion of the first electrode 21a is covered by an edge cover 22a provided in a lattice pattern common to the plurality of subpixels P. Examples of materials constituting the edge cover 22a include a positive-working photosensitive resin such as polyimide resin, acrylic resin, polysiloxane resin, and novolak resin. Further, as illustrated in FIG. 3, a part of a surface of the edge cover 22a projects upward in the drawing and becomes pixel photospacers 22p each provided in an island shape as first photospacers.

The organic EL layer 23 includes a hole injection layer 1, a hole transport layer 2, a light-emitting layer 3, an electron transport layer 4, and an electron injection layer 5, which are sequentially provided on the first electrode 21a, as illustrated in FIG. 5.

The hole injection layer 1 is also referred to as an anode buffer layer, functions to reduce an energy level difference between the first electrode 21a and the organic EL layer 23 to thereby improve the hole injection efficiency from the first electrode 21a to the organic EL layer 23, and is provided as a common functional layer of an organic vapor deposition layer common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives and the like. Note that the common functional layer is a functional layer formed using a common metal mask (CMM). This CMM is a mask in which one opening is provided corresponding to one display device, and thus cannot include a pattern that shields the non-display region N having an island shape. Accordingly, the common functional layer is also deposited on the non-display region N. In contrast, an individual functional layer is a functional layer formed using a fine metal mask (FMM). This FMM is a mask in which an opening is provided for each color (e.g., including a functional layer common in red and green). Furthermore, in addition to the hole injection layer 1 described above, the functional layer includes the hole transport layer 2, the light-emitting layer 3, the electron transport layer 4, the electron injection layer 5, and the like.

The hole transport layer 2 functions to improve the transport efficiency of holes from the first electrode 21a to the organic EL layer 23, and is provided as a common functional layer of an organic vapor deposition layer common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide and the like.

The light-emitting layer 3 is provided as an individual functional layer which is a region where holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having high light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like.

The electron transport layer 4 functions to facilitate migration of electrons to the light-emitting layer 3 efficiently, and is provided as a common functional layer of an inorganic vapor deposition layer common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds and the like, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer, and is provided as a common functional layer of an inorganic vapor deposition layer common to the plurality of subpixels P. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO) and the like.

Note that the common functional layers described above are exemplary, and any of the layers may be an individual functional layer. For example, in a case where the display device is configured by performing color conversion using a quantum-dot light emitting diode (QLED) or the like from a light-emitting layer emitting ultraviolet light or blue light, the light-emitting layer 3 may be provided as a common functional layer.

As illustrated in FIG. 3, the second electrode 24 is provided so as to cover the organic EL layers 23 and the edge cover 22a to be common to the plurality of subpixels P. In addition, the second electrode 24 functions to inject electrons into the organic EL layer 23. In addition, the second electrode 24 is preferably formed of a material having a low work function to improve the efficiency of electron injection into the organic EL layer 23. Here, examples of materials that may be included in the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al) and the like.

As illustrated in FIG. 3, FIG. 6, and FIG. 9, the sealing film 40 is provided so as to cover the organic EL elements 25, and functions to protect the organic EL layer 23 of each of the organic EL elements 25 from moisture, oxygen, and the like. Specifically, as illustrated in FIG. 3, FIG. 6, and FIG. 9, the sealing film 40 includes a lower second inorganic insulating film 36 provided on the resin substrate layer 10 side so as to cover the second electrode 24, an upper second inorganic insulating film 38 provided on the side opposite to the resin substrate layer 10, and an organic insulating film 37 provided between the lower second inorganic insulating film 36 and the upper second inorganic insulating film 38. Here, the lower second inorganic insulating film 36 and the upper second inorganic insulating film 38 are each formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$), or silicon carbonitride (SiCN). On the other hand, the organic insulating film 37 is formed of, for example, an organic material such as acrylic resin, polyurea resin, parylene resin, polyimide resin, or polyamide resin.

Additionally, as illustrated in FIG. 1 and FIG. 6, the organic EL display device 50a includes, in the frame region F, a first external dam wall Wa provided in a frame-like shape so as to surround the display region D and overlap with an outer peripheral end portion of the organic insulating film 37, and a second external dam wall Wb provided in a frame-like shape so as to surround the first external dam wall Wa.

As illustrated in FIG. 6, the first external dam wall Wa includes a first resin layer 19b formed of the same material as and in the same layer as those of the flattening film 19a, and a second resin layer 22c that is provided on the first resin layer 19b via the first conductive layer 21b and is formed of the same material as and in the same layer as those of the edge cover 22a. Here, as illustrated in FIG. 6, the first conductive layer 21b is provided in a substantially C shape in such a manner as to overlap with the trench G, the first external dam wall Wa, and the second external dam wall Wb in the frame region F. Note that the first conductive layer 21b is formed of the same material as and in the same layer as those of the first electrode 21a.

As illustrated in FIG. 6, the second external dam wall Wb includes a first resin layer 19c formed of the same material as and in the same layer as those of the flattening film 19a, and a second resin layer 22d that is provided on the first resin layer 19c via the first conductive layer 21b and is formed of the same material as and in the same layer as those of the edge cover 22a.

As illustrated in FIG. 3, and FIG. 6, the organic EL display device 50a includes a first frame wiring line 18h provided outside of the trench G in such a manner as to surround the display region D and overlap with the first external dam wall Wa and the second external dam wall Wb, in the frame region F. Here, the first frame wiring line 18h is electrically connected to a power supply terminal to which a low power supply voltage (ELVSS) is input at the terminal portion T. Further, as illustrated in FIG. 6, the first frame wiring line 18h is electrically connected to the second electrode 24 via the first conductive layer 21b.

In addition, as illustrated in FIG. 3, the organic EL display device 50a includes a second frame wiring line 18i provided inside of the trench G in the frame region F. Here, the second frame wiring line 18i is electrically connected to a power supply terminal to which a high power supply voltage (ELVDD) is input at the terminal portion T. The second frame wiring line 18i is electrically connected, on the display region D side, to the plurality of power source lines 18g disposed in the display region D.

Furthermore, as illustrated in FIG. 7, the organic EL display device 50a includes: a lower layer flattening film 8a provided to be filled in a slit S formed in the base coat film 11, the gate insulating film 13, the first interlayer insulating film 15, and the second interlayer insulating film 17; a plurality of lead wiring lines 18j provided on the lower layer flattening film 8a and the second interlayer insulating film 17; and a wiring line covering layer 19d provided so as to cover the plurality of lead wiring lines 18j, in the bending portion B.

As illustrated in FIG. 7, the slit S is provided to be formed in a groove shape that penetrates the base coat film 11, the gate insulating film 13, the first interlayer insulating film 15, and the second interlayer insulating film 17, and proceeds along a direction in which the bending portion B extends so as to expose the surface of the resin substrate layer 10.

The lower layer flattening film 8a is formed of, for example, an organic resin material such as a polyimide resin.

The plurality of lead wiring lines 18j are provided so as to extend parallel to each other in a direction orthogonal to the direction in which the bending portion B extends. Here, as illustrated in FIG. 7, both end portions of each of the lead wiring lines 18j are electrically connected to a first gate conductive layer 14c and a second gate conductive layer 14d, respectively, via respective contact holes formed in layered films of the first interlayer insulating film 15 and the second interlayer insulating film 17. Note that the lead wiring lines 18j are each formed of the same material as and in the same layer as those of the source line 18f and the power source line 18g. Further, as illustrated in FIG. 7, the first gate conductive layer 14c is provided between the gate insulating film 13 and the first interlayer insulating film 15, and is electrically connected to signal wiring lines (the gate line 14, the source line 18f, and the like) extending in the display region D. Further, as illustrated in FIG. 7, the second gate conductive layer 14d is provided between the gate insulating film 13 and the first interlayer insulating film 15, and is electrically connected to a signal terminal of the terminal portion T. Further, the wiring line covering layer 19d is formed of the same material as and in the same layer as those of the flattening film 19a.

As illustrated in FIG. 3 and FIG. 6, the organic EL display device 50a includes a plurality of frame photospacers 22b each provided in an island shape as second photospacers in such a manner as to project upward in the drawing, on the flattening film 19a in the frame region F. Here, the frame photospacers 22b are each formed of the same material as and in the same layer as those of the edge cover 22a. The frame photospacers 22b each may be formed by layering a resin layer formed of the same material as and in the same layer as those of the edge cover 22a, and another layer.

As illustrated in FIG. 8 and FIG. 9, the organic EL display device 50a includes a first internal dam wall We and a second internal dam wall Wd each provided in a circular frame shape from the display region D side so as to surround an oxide semiconductor layer 12c, which will be described below, in a plan view, in the non-display region N.

As illustrated in FIG. 9, the first internal dam wall We includes a first resin layer 19e formed of the same material as and in the same layer as those of the flattening film 19a, and a second resin layer 22e that is provided on the first resin layer 19e and is formed of the same material as and in the same layer as those of the edge cover 22a. Here, as illustrated in FIG. 9, the first internal dam wall We is provided on the display region D side of the non-display region N so as to overlap with an inner peripheral end portion of the organic insulating film 37 constituting the sealing film 40.

As illustrated in FIG. 9, the second internal dam wall Wb includes a first resin layer 19f formed of the same material as and in the same layer as those of the flattening film 19a, and a second resin layer 22f that is provided on the first resin layer 19f and is formed of the same material as and in the same layer as those of the edge cover 22a.

Further, as illustrated in FIG. 9, the organic EL display device 50a includes a plurality of non-display photospacers 22c each provided in an island shape as third photospacers so as to project upward in the drawing, on the flattening film 19a on the display region D side of the first internal dam wall Wc in the non-display region N. Here, the non-display photospacers 22c are each formed of the same material as and in the same layer as those of the edge cover 22a. The non-display photospacers 22c each may be formed by layering a resin layer formed of the same material as and in the same layer as those of the edge cover 22a, and another layer.

As illustrated in FIG. 8 and FIG. 9, the organic EL display device 50a includes the oxide semiconductor layer 12c (see the dotted portion in FIG. 8) provided in a circular frame-shaped island shape along the peripheral edge of the through hole H, that is, along the boundary with the display region D, in the non-display region N. Here, as illustrated in FIG. 9, the oxide semiconductor layer 12c is provided on the base coat film 11, and is formed of the same material as and in the same layer as those of the semiconductor layers 12a and 12b. Furthermore, as illustrated in FIG. 9, the peripheral end portion of the oxide semiconductor layer 12c on the through hole H side has a side surface flush with the side surface of the through hole H and is provided along the peripheral edge of the through hole H. In addition, as illustrated in FIG. 9, the peripheral end portion of the oxide semiconductor layer 12c on the second internal dam wall Wd side is covered by the gate insulating film 13. Furthermore, as illustrated in FIG. 8 and FIG. 9, in the gate insulating film 13, the first interlayer insulating film 15, and the second interlayer insulating film 17, a first opening Ma is provided in the non-display region N so as to surround the through hole H in a plan view and expose the oxide semiconductor layer 12c. Note that as illustrated in FIG. 9, the peripheral portion of the first opening Ma is provided so as to cover the outer peripheral end portion of the oxide semiconductor layer 12c and is configured to function as an etching stopper when the oxide semiconductor layer 12c forms the first opening Ma. Furthermore, as illustrated in FIG. 9, the second electrode 24 is provided so as to extend from the display region D to the non-display region N. In addition, as illustrated in FIG. 8 and FIG. 9, a third opening Mc is provided in the second electrode 24 in a frame-like shape so as to surround the through hole H in a plan view and expose the oxide semiconductor layer 12c. Note that, although the hole injection layer 1, the hole transport layer 2, the electron transport layer 4, and the electron injection layer 5 are not illustrated in FIG. 9, the common functional layer including the hole injection layer 1, the hole transport layer 2, the electron transport layer 4, and the electron injection layer 5 is provided so as to extend from the display region D to the non-display region N as with the second electrode 24, and a second opening Mb is provided in a frame-like shape in the common functional layer so as to surround the through hole H in a plan view and expose the oxide semiconductor layer 12c. Furthermore, as illustrated in FIG. 8 and FIG. 9, the peripheral ends of the second opening Mb and the third opening Mc coincide with each other, and the oxide semiconductor layer 12c and the lower second inorganic insulating film 36 of the sealing film 40 are in contact with each other via the second opening Mb and the third opening Mc, as illustrated in FIG. 9.

In addition, as illustrated in FIG. 8 and FIG. 9, in the organic EL display device 50a, a fourth opening Md is provided in the lower second inorganic insulating film 36 and the upper second inorganic insulating film 38 that constitute the sealing film 40 so as to surround the through hole H, in the non-display region N. Here, as illustrated in FIG. 9, the second electrode 24 is exposed through the fourth opening Md, in the periphery of the through hole H.

As illustrated in FIG. 1 and FIG. 8, the organic EL display device 50a includes a camera 45 installed as an electronic component inside the through hole H in the non-display region N. Here, the camera 45 is composed of a charge coupled device (CCD), a complementary metal oxide semiconductor (CMOS) image sensor, or the like, and is mounted inside a housing accommodating the organic EL display device 50a. Note that in the present embodiment, the camera 45 is exemplified as an electronic component, but the electronic component may be a fingerprint sensor or the like.

In the organic EL display device 50a described above, in each subpixel P, a gate signal is input to the first TFT 9a via the gate line 14 to turn on the first TFT 9a, a data signal is written in the gate electrode 14b of the second TFT 9b and the capacitor 9c via the source line 18f, and a current from the power source line 18g corresponding to the gate voltage of the second TFT 9b is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Figure 10:
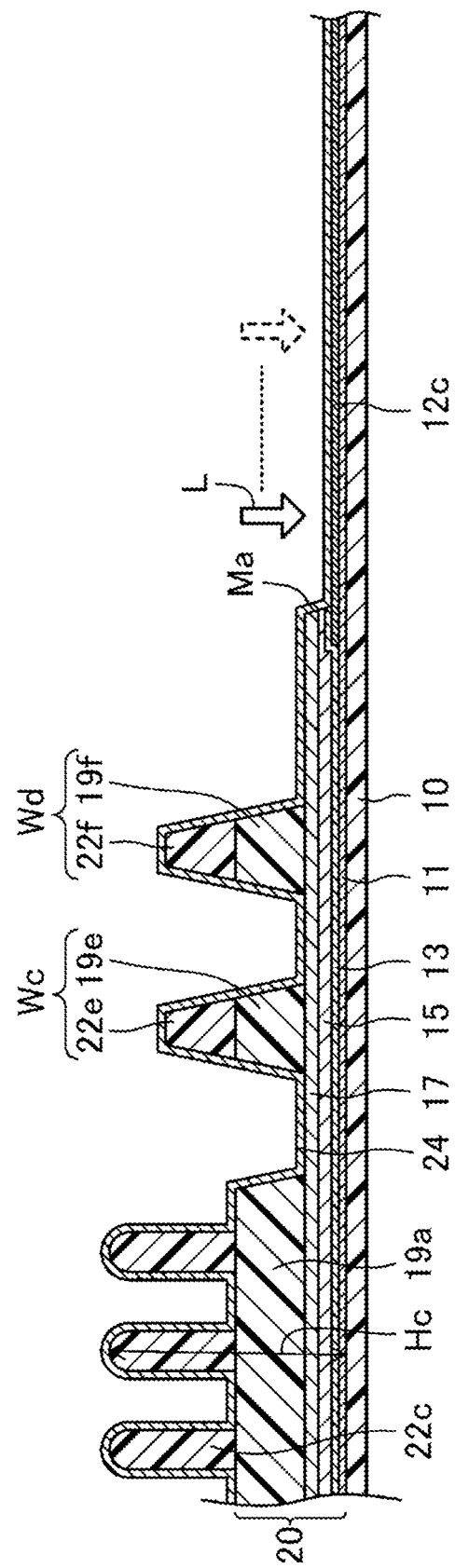
FIG. 10 is a cross-sectional view illustrating a functional layer removal step of an organic EL element layer forming step in a method for manufacturing the organic EL display device according to the first embodiment of the disclosure.

Next, a method for manufacturing the organic EL display device 50a according to the present embodiment will be described. Note that the method for manufacturing the organic EL display device 50a according to the present embodiment includes a TFT layer forming step, an organic EL element layer forming step, a sealing film forming step, a flexing step, and a component mounting step. Note that FIG. 10 is a cross-sectional view illustrating a functional layer removal step of an organic EL element layer forming step in the method for manufacturing the organic EL display device 50a.

TFT Layer Forming Step

For example, by using a known method, the TFT layer 20 is formed by forming the base coat film 11, the first TFT 9a, the second TFT 9b, the capacitor 9c, and the flattening film 19a on a surface of the resin substrate layer 10 formed on a glass substrate.

Here, when the semiconductor layer 12a of the first TFT 9a and the semiconductor layer 12b of the second TFT 9b are formed, the oxide semiconductor layer 12c is formed in an island shape in the non-display region N (semiconductor layer forming step). Furthermore, when a contact hole is formed in the step of forming the first TFT 9a and the second TFT 9b, the first opening Ma is formed in the gate insulating film 13, the first interlayer insulating film 15, and the second interlayer insulating film 17 so as to expose the oxide semiconductor layer 12c, in the non-display region N (first opening forming step).

Organic EL Element Layer Forming Step (Light-emitting Element Layer Forming Step) First, on the flattening film 19a of the TFT layer 20, which is formed in the TFT layer forming step described above, the first electrode 21a and the edge cover 22a are formed by using a known method.

Subsequently, the hole injection layer 1, the hole transport layer 2, the light-emitting layer 3, the electron transport layer 4, and the electron injection layer 5 are sequentially formed on the first electrode 21a exposed from the edge cover 22a by, for example, a vacuum vapor deposition technique to form the organic EL layer 23 (functional layer forming step). Note that when the hole injection layer 1, the hole transport layer 2, the electron transport layer 4, and the electron injection layer 5 are formed, the CMM is used as the vapor deposition mask, and when the light-emitting layer 3 is formed, the FMM is used as the vapor deposition mask.

Thereafter, the second electrode 24 is formed using the CMM by, for example, the vacuum vapor deposition technique so as to cover the organic EL layer 23 and extend from the display region D to the non-display region N.

Furthermore, as illustrated in FIG. 10, the oxide semiconductor layer 12c is scanned in an annular shape in a plan view while being irradiated with laser light L having a wavelength of the ultraviolet range (for example, about 300 nm to 400 nm) to remove the hole injection layer 1, the hole transport layer 2, the electron transport layer 4, the electron injection layer 5, and the second electrode 24 in a portion covering the oxide semiconductor layer 12c, whereby the second opening Mb is formed in the hole injection layer 1, the hole transport layer 2, the electron transport layer 4, and the electron injection layer 5 in such a manner that the peripheral end of the second opening Mb is surrounded by the first opening Ma in a plan view and the oxide semiconductor layer 12c is exposed, and the third opening Mc is formed in the second electrode 24 (functional layer removal step). Here, in the functional layer removal step, energy of the laser light L is converted to heat by irradiating the oxide semiconductor layer 12c with the laser light L, and at least the hole injection layer 1 of the lowest layer is sublimated and removed. With the sublimation of at least the hole injection layer 1 of the lowest layer, the upper layer thereof is detached from the oxide semiconductor layer 12c and removed. At least one layer of the hole transport layer 2, the electron transport layer 4, and the electron injection layer 5 above the hole injection layer 1 may also be sublimated and removed. Furthermore, the second electrode 24 is detached and removed with sublimation of the lower layer thereof.

As described above, the organic EL element 25 is formed to form the organic EL element layer 30.

Sealing Film Forming Step

First, on a surface of the substrate on which the organic EL element layer 30 formed in the organic EL element layer forming step described above is formed, the lower second inorganic insulating film 36 is formed using a mask by, for example, forming an inorganic insulating film such as a silicon nitride film, a silicon oxide film, or a silicon oxynitride film, by a plasma chemical vapor deposition (CVD) method. Thus, the lower second inorganic insulating film 36 can be formed in the non-display region N so as to cover the oxide semiconductor layer 12c exposed from the second opening Mb and the third opening Mc.

Subsequently, on a surface of the substrate on which the lower second inorganic insulating film 36 is formed, an organic resin material such as an acrylic resin is film-formed by using, for example, an ink-jet method to form the organic insulating film 37.

Thereafter, on the substrate on which the organic insulating film 37 is formed, the upper second inorganic insulating film 38 is formed using a mask by, for example, forming an inorganic insulating film such as a silicon nitride film, a silicon oxide film, and a silicon oxynitride film, by the plasma CVD method.

Furthermore, after a resist pattern is formed on the upper second inorganic insulating film 38, the upper second inorganic insulating film 38 and the lower second inorganic insulating film 36 exposed from the resist pattern are removed by dry etching in the non-display region N to form the fourth opening Md, thereby forming the sealing film 40.

Flexing Step

First, after a protective sheet (not illustrated) is bonded to a surface of the substrate on which the sealing film 40 is formed in the sealing film forming step, by irradiation with laser light from the glass substrate side of the resin substrate layer 10, the glass substrate is peeled off from a lower surface of the resin substrate layer 10, and subsequently, a protective sheet (not illustrated) is bonded to the lower surface of the resin substrate layer 10 from which the glass substrate has been peeled off.

Furthermore, the second electrode 24, the oxide semiconductor layer 12c, the base coat film 11, and the resin substrate layer 10 exposed from the fourth opening Md are irradiated with laser light while being scanned in an annular shape by, for example, using a yttrium aluminum garnet (YAG) laser to form the through hole H so as to be surrounded by the peripheral end of the fourth opening Md (through hole forming step).

Component Mounting Step

The camera 45 is mounted in, for example, a housing accommodating the device body so as to be installed inside the through hole H formed in the aforementioned flexing step.

The organic EL display device 50a of the present embodiment can be manufactured in this manner.

Note that in the present embodiment, the organic EL display device 50a in which the second electrode 24 is provided to be exposed from the sealing film 40 in the periphery of the through hole His exemplified. However, the disclosure may be embodied by organic EL display devices 50b and 50c in which the resin substrate layer 10 and the oxide semiconductor layer 12c are provided so as to be exposed from the sealing film 40 in the periphery of the through hole H.

The organic EL display device 50b and the organic EL display device 50c will be described below.

First Modified Example

Figure 11:
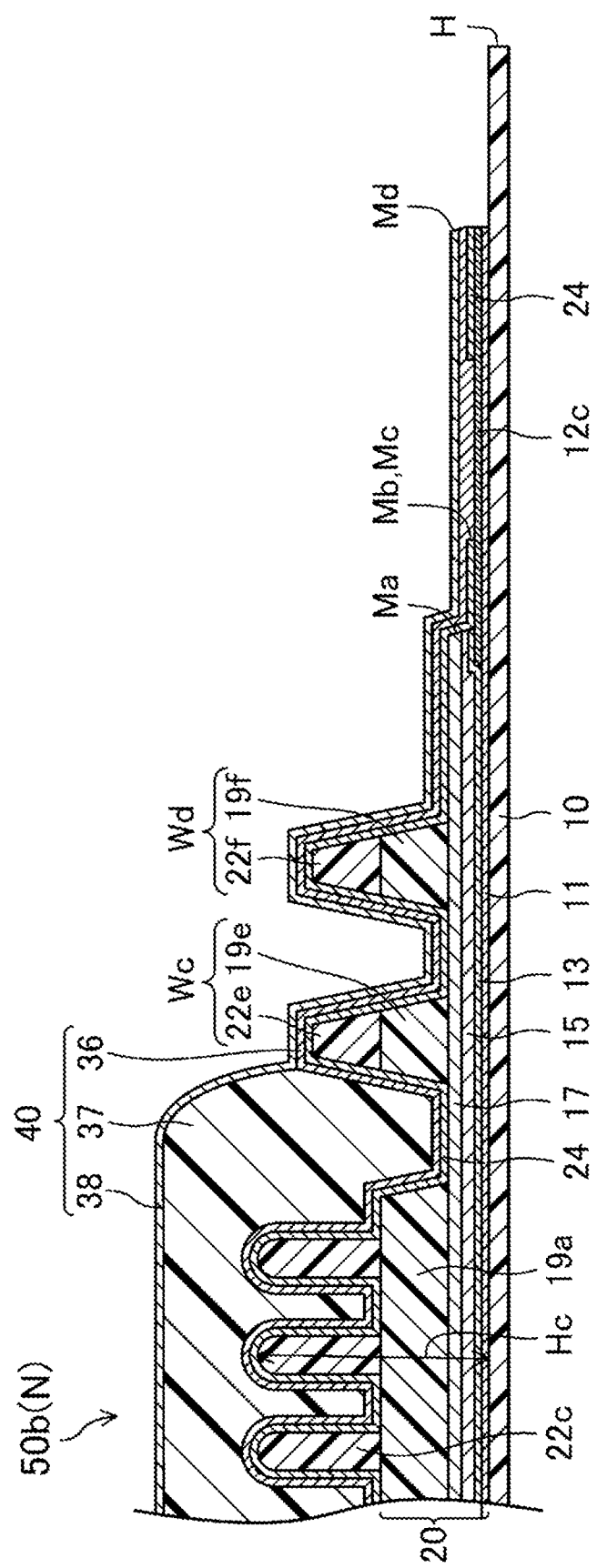
FIG. 11 is a cross-sectional view of a non-display region of a first modified example of the organic EL display device according to the first embodiment of the disclosure, and is a view corresponding to FIG. 9.

FIG. 11 is a cross-sectional view of a non-display region N of the organic EL display device 50b of a first modified example, and is a view corresponding to FIG. 9. Note that, in the following modified examples, portions identical to those in FIG. 1 to FIG. 10 are denoted by the same reference signs, and their detailed descriptions are omitted.

In the organic EL display device 50b, in the periphery of the through hole H of the non-display region N, the second electrode 24, the oxide semiconductor layer 12c, and the base coat film 11 (see FIG. 9) exposed from the fourth opening Md formed in the sealing film 40 of the present embodiment are further removed, and thus the upper surface of the resin substrate layer 10 is provided so as to be exposed from the fourth opening Md, as illustrated in FIG. 11. Note that the configuration of the display region D and the frame region F of the organic EL display device 50b is substantially the same as the configuration of the display region D and the frame region F of the organic EL display device 50a of the present embodiment.

According to the organic EL display device 50b having the configuration described above, the second electrode 24, the oxide semiconductor layer 12c, and the base coat film 11 are not disposed in the portion that is irradiated with the laser light L when forming the through hole H. Thus, when the through hole H is formed, generation of cracks can be suppressed in the second electrode 24, the oxide semiconductor layer 12c, and the base coat film 11.

Second Modified Example

Figure 12:
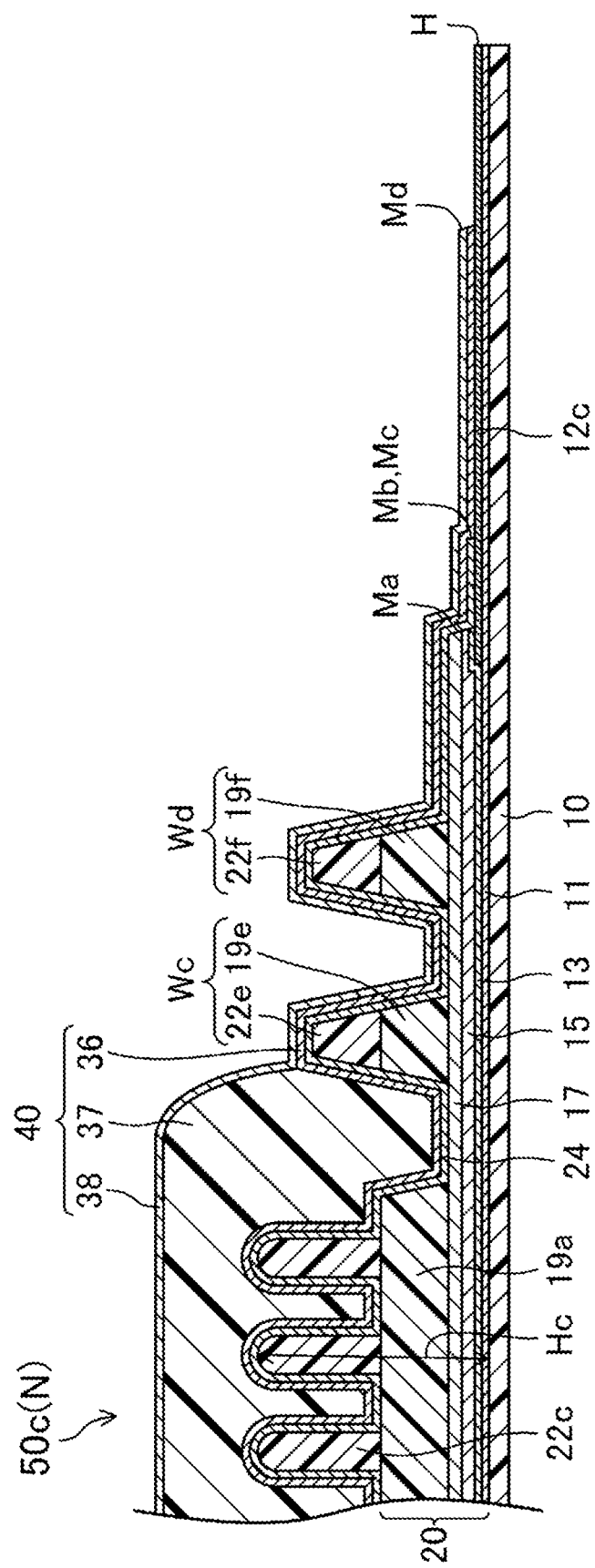
FIG. 12 is a cross-sectional view of a non-display region of a second modified example of the organic EL display device according to the first embodiment of the disclosure, and is a view corresponding to FIG. 9.

FIG. 12 is a cross-sectional view of a non-display region N of the organic EL display device 50c according to a second modified example, and is a view corresponding to FIG. 9.

In the organic EL display device 50c, as illustrated in FIG. 12, the second opening Mb formed in the hole injection layer 1, the hole transport layer 2, the electron transport layer 4, and the electron injection layer 5, and the third opening Mc formed in the second electrode 24 are provided so as to extend to the peripheral edge of the through hole H. Note that the configuration of the display region D and the frame region F of the organic EL display device 50c is substantially the same as the configuration of the display region D and the frame region F of the organic EL display device 50a of the present embodiment.

The organic EL display device 50c having the configuration described above can be manufactured by scanning the oxide semiconductor layer 12c in a circular shape rather than an annular shape in a plan view while irradiating the oxide semiconductor layer 12c with the laser light L to remove the second electrode 24 (hole injection layer 1, hole transport layer 2, electron transport layer 4, and electron injection layer 5, see FIG. 9) on the through hole H side, in the functional layer removal step of the present embodiment.

As described above, according to the organic EL display devices 50a to 50c and the method for manufacturing the same of the present embodiment including the modified examples, the oxide semiconductor layer 12c is provided in a circular frame shape in the non-display region N in an island shape disposed inside the display region D. Furthermore, the first opening Ma is provided in the gate insulating film 13, the first interlayer insulating film 15, and the second interlayer insulating film 17 of the TFT layer 20 in the non-display region N so as to expose the oxide semiconductor layer 12c. Accordingly, in the functional layer removal step of the organic EL element layer forming step, the oxide semiconductor layer 12c exposed from the gate insulating film 13, the first interlayer insulating film 15, and the second interlayer insulating film 17 is irradiated with the laser light L to convert energy of the laser light L to heat, so that the hole injection layer 1, the hole transport layer 2, the electron transport layer 4, and the electron injection layer 5 as the common functional layer and the second electrode 24, which are formed in the non-display region N, can be removed. Here, the oxide semiconductor layer 12c has a lower light reflectance than that of a metal layer, for example, and thus even if the oxide semiconductor layer 12c is irradiated with the laser light L, reflection of the laser light L is suppressed, so that damage to the organic EL layer 23 due to stray light of the reflected light of the laser light L can be suppressed. As a result, damage to the organic EL layer 23 provided in each subpixel P in the display region D is suppressed, so that the common functional layer in the non-display region N can be removed while suppressing damage to the organic EL layer 23 in the display region D. In addition, as described above, the oxide semiconductor layer 12c has a low light reflectance, and thus damage to a laser light irradiation device caused by the reflected light of the laser light L can be suppressed. Furthermore, the oxide semiconductor layer 12c has a low light reflectance, and thus reflection due to external light can be suppressed, so that a reduction in display quality due to unnecessary reflected light can be suppressed.

In addition, according to the organic EL display devices 50a to 50c and the method for manufacturing the same of the present embodiment including the modified examples, in the non-display region N, the lower second inorganic insulating film 36 and the oxide semiconductor layer 12c are in contact with each other via the second opening Mb formed in the hole injection layer 1, the hole transport layer 2, the electron transport layer 4, and the electron injection layer 5 and the third opening Mc formed in the second electrode 24. Thus, sealing performance due to the sealing film 40 can be reliably ensured.

Second Embodiment

Figure 13:
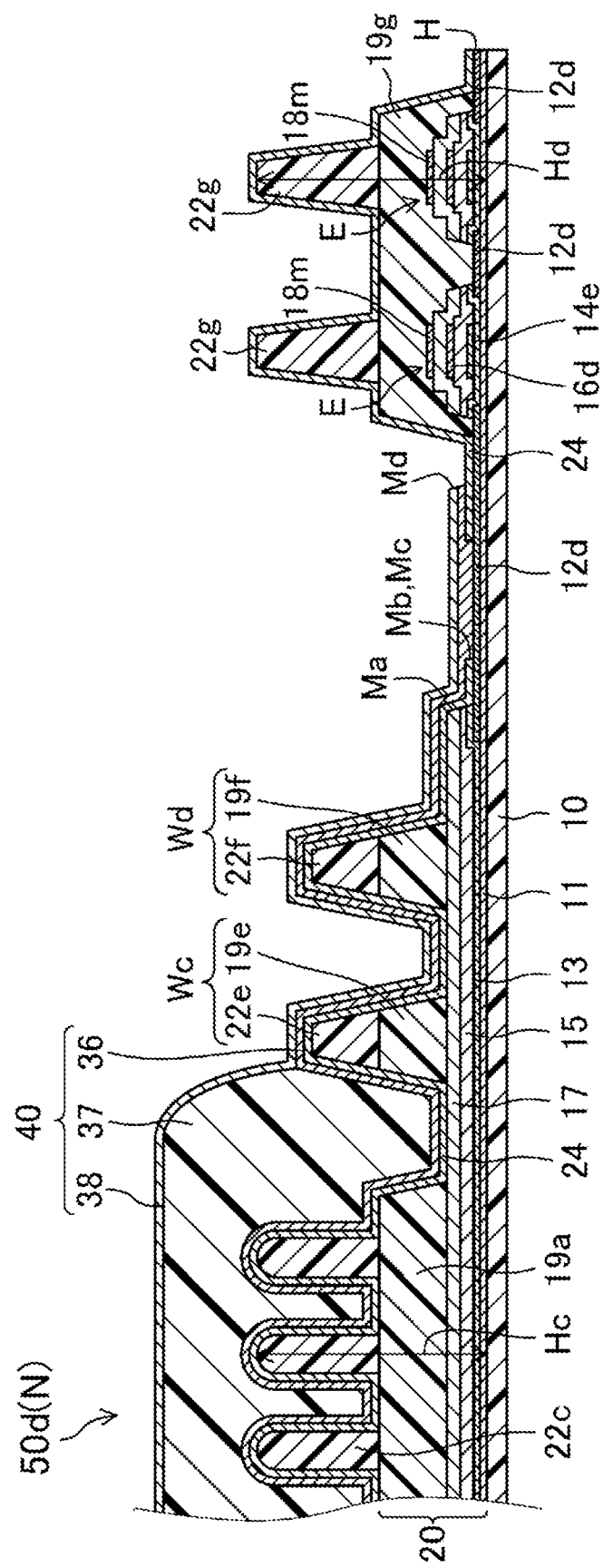
FIG. 13 is a cross-sectional view of a non-display region of an organic EL display device according to a second embodiment of the disclosure, and is a view corresponding to FIG. 9.

FIG. 13 illustrates a second embodiment of a display device and a method for manufacturing the same according to the disclosure. Here, FIG. 13 is a cross-sectional view of a non-display region of an organic EL display device 50d according to the present embodiment, and is a view corresponding to FIG. 9. Note that, in the following embodiment, portions identical to those in FIG. 1 to FIG. 12 are denoted by the same reference signs, and their detailed descriptions are omitted.

In the first embodiment described above, the organic EL display devices 50a to 50c in which the surface between the fourth opening Md and the through hole H is provided flat in the non-display region N are exemplified. However, the disclosure may be embodied by the organic EL display device 50d in which a structure having a convex shape is provided between the fourth opening Md and the through hole H.

As with the organic EL display device 50a of the first embodiment described above, the organic EL display device 50d includes the display region D provided in a rectangular shape in which an image is displayed and the frame region F provided in a frame-like shape in a periphery of the display region D.

The configuration of the display region D and the frame region F of the organic EL display device 50d is substantially the same as the configuration of the display region D and the frame region F of the organic EL display device 50a according to the first embodiment described above.

As illustrated in FIG. 13, the organic EL display device 50d includes the first internal dam wall We and the second internal dam wall Wd each provided in a circular frame shape from the display region D side so as to surround an oxide semiconductor layer 12d, which will be described below, in a plan view, in the non-display region N.

As illustrated in FIG. 13, the organic EL display device 50d includes a plurality of non-display photospacers 22c each provided in an island shape as the third photospacers so as to project upward in the drawing, on the flattening film 19a on the display region D side of the first internal dam wall We in the non-display region N.

As illustrated in FIG. 13, the organic EL display device 50d includes the oxide semiconductor layer 12d provided in an island shape having a triple concentric circular frame shape in the non-display region N along the peripheral edge of the through hole H, that is, along the boundary with the display region D. Here, the oxide semiconductor layer 12d is provided on the base coat film 11, and is formed of the same material as and in the same layer as those of the semiconductor layers 12a and 12b. In addition, as illustrated in FIG. 13, the peripheral end portion of the oxide semiconductor layer 12d on the through hole H side has a side surface flush with the side surface of the through hole H and is provided along the peripheral edge of the through hole H. Furthermore, as illustrated in FIG. 13, the peripheral end portion of the oxide semiconductor layer 12d on the second internal dam wall Wd side is covered by the gate insulating film 13. In addition, as illustrated in FIG. 13, the first opening Ma is provided in the gate insulating film 13, the first interlayer insulating film 15, and the second interlayer insulating film 17 so as to surround the through hole H in a plan view and expose the oxide semiconductor layer 12d, in the non-display region N. Note that, as illustrated in FIG. 13, the peripheral portion of the first opening Ma is provided so as to cover the outer peripheral end portion of the oxide semiconductor layer 12d, and is configured to function as an etching stopper when the oxide semiconductor layer 12d forms the first opening Ma. As illustrated in FIG. 13, the second electrode 24 is provided so as to extend from the display region D to the non-display region N. In addition, as illustrated in FIG. 13, the third opening Mc is provided in a frame-like shape in the second electrode 24 so as to surround the through hole H in a plan view and expose the oxide semiconductor layer 12d. Note that although the hole injection layer 1, the hole transport layer 2, the electron transport layer 4, and the electron injection layer 5 are not illustrated in FIG. 13, the common functional layer including the hole injection layer 1, the hole transport layer 2, the electron transport layer 4, and the electron injection layer 5 is provided so as to extend from the display region D to the non-display region N as with the second electrode 24, and the second opening Mb is provided in a frame-like shape in the common functional layer so as to surround the through hole H in a plan view and expose the oxide semiconductor layer 12d. Furthermore, as illustrated in FIG. 13, the peripheral ends of the second opening Mb and the third opening Mc coincide with each other, and the oxide semiconductor layer 12d and the lower second inorganic insulating film 36 of the sealing film 40 are in contact with each other via the second opening Mb and the third opening Mc.

As illustrated in FIG. 13, the organic EL display device 50d includes, in the non-display region N, a pair of layered thick film portions E provided in a frame-like shape so as to surround the through hole H, between the first opening Ma and the through hole H, specifically between the fourth opening Md and the through hole H.

As illustrated in FIG. 13, each of the layered thick film portions E includes the base coat film 11, the gate insulating film 13, a thick film gate metal layer 14e, the first interlayer insulating film 15, a thick film intermediate metal layer 16d, the second interlayer insulating film 17, and a thick film source metal layer 18m, which are sequentially provided as a plurality of inorganic films in this order, over the resin substrate layer 10. Here, the total thickness of the plurality of inorganic films (base coat film 11 to thick film source metal layer 18m) in each of the layered thick film portions E is greater than the total thickness of the plurality of inorganic films (base coat film 11 to oxide semiconductor layer 12d) in the through hole H.

As illustrated in FIG. 13, in the organic EL display device 50d, in the non-display region N, a resin layer 19g is provided in a frame-like shape so as to surround the through hole H in a plan view between the first opening Ma and the through hole H, specifically between the fourth opening Md and the through hole H. Here, the resin layer 19g is formed of the same material as and in the same layer as those of the flattening film 19a. In addition, as illustrated in FIG. 13, a plurality of fourth photospacers 22g are each provided in an island shape on the resin layer 19g. Note that as illustrated in FIG. 13, a height Hd of each of the fourth photospacers 22g from the upper face of the resin substrate layer 10 is the same as a height Ha of each of the pixel photospacers 22p (see FIG. 3), a height Hb of each of the frame photospacers 22b (see FIG. 6), and a height Hc of each of the non-display photospacers 22c, from the upper face of the resin substrate layer 10. In addition, as illustrated in FIG. 13, the pair of layered thick film portions E are provided inside the resin layer 19g. Furthermore, as illustrated in FIG. 13, the lower second inorganic insulating film 36 and the upper second inorganic insulating film 38 of the sealing film 40 are provided so as to surround the resin layer 19g and the layered thick film portions E.

The organic EL display device 50d includes a camera 45 installed as an electronic component inside the through hole H in the non-display region N.

Similarly to the organic EL display device 50a of the first embodiment, the organic EL display device 50d described above is flexible and is configured to display an image by causing the light-emitting layer 3 of the organic EL layer 23 to emit light as required, via the first TFT 9a and the second TFT 9b in each of the subpixels P.

The organic EL display device 50d of the present embodiment can be manufactured by forming the layered thick film portion E when forming the first TFT 9a and the second TFT 9b, forming the resin layer 19g when forming the flattening film 19a, and forming the fourth photospacers 22g when forming the edge cover 22a in the method for manufacturing the organic EL display device 50a of the first embodiment.

As described above, according to the organic EL display device 50d and the method for manufacturing the same of the present embodiment, the oxide semiconductor layer 12d is provided in a circular frame shape in the non-display region N in an island shape disposed inside the display region D. Furthermore, the first opening Ma is provided in the gate insulating film 13, the first interlayer insulating film 15, and the second interlayer insulating film 17 of the TFT layer 20 in the non-display region N so as to expose the oxide semiconductor layer 12d. Accordingly, in the functional layer removal step of the organic EL element layer forming step, the oxide semiconductor layer 12d exposed from the gate insulating film 13, the first interlayer insulating film 15, and the second interlayer insulating film 17 is irradiated with the laser light L to convert energy of the laser light L to heat, so that the hole injection layer 1, the hole transport layer 2, the electron transport layer 4, the electron injection layer 5, and the second electrode 24 formed in the non-display region N can be removed. Here, the oxide semiconductor layer 12d has a lower light reflectance than that of the metal layer, for example, and thus even if the oxide semiconductor layer 12d is irradiated with the laser light L, reflection of the laser light L is suppressed, so that damage to the organic EL layer 23 due to the reflected light of the laser light L can be suppressed. As a result, damage to the organic EL layer 23 provided in each subpixel P in the display region D is suppressed, so that the common functional layer in the non-display region N can be removed while suppressing damage to the organic EL layer 23 in the display region D. In addition, as described above, the oxide semiconductor layer 12d has a low light reflectance, and thus damage to the laser light irradiation device caused by the reflected light of the laser light L can be suppressed. Furthermore, the oxide semiconductor layer 12d has a low light reflectance, and thus reflection due to external light can be suppressed, so that a reduction in display quality due to unnecessary reflected light can be suppressed.

In addition, according to the organic EL display device 50d and the method for manufacturing the same of the present embodiment, in the non-display region N, the lower second inorganic insulating film 36 and the oxide semiconductor layer 12d are in contact with each other via the second opening Mb formed in the hole injection layer 1, the hole transport layer 2, the electron transport layer 4, and the electron injection layer 5 and the third opening Mc formed in the second electrode 24, and thus sealing performance due to the sealing film 40 can be reliably ensured.

Furthermore, according to the organic EL display device 50d and the method for manufacturing the same of the present embodiment, acoustic compliances (volume/(density×sound velocity$^2$)) of the plurality of inorganic films constituting each of the layered thick film portions E are almost the same. Thus, by disposing the layered thick film portions E having a thickness greater than the total film thickness of the inorganic films in the through holes H in the periphery of the through hole H, propagation of cracks formed on the side surface of the through hole H to the display region D side can be suppressed.

Other Embodiments

In each of the embodiments described above, the organic EL layer having a five-layered structure including the hole injection layer, the hole transport layer, the light-emitting layer, the electron transport layer, and the electron injection layer is exemplified, but the organic EL layer may have a three-layered structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In the above-described embodiments, the example of the organic EL display device in which the electrode of the TFT connected to the first electrode serves as the drain electrode is given. However, the disclosure is also applicable to an organic EL display device in which the electrode of the TFT connected to the first electrode is referred to as the source electrode.

In the embodiments described above, the organic EL display devices 50a to 50d each having the through hole H formed in a circular shape in a plan view are exemplified, but the through hole H may have a polygonal shape such as a rectangular shape in a plan view, for example.

In the embodiments described above, the organic EL display devices 50a to 50d each including the sealing film 40 in which the organic insulating film 37 is provided between the lower second inorganic insulating film 36 and the upper second inorganic insulating film 38 are exemplified, but the disclosure is also applicable to an organic EL display device obtained by forming an organic vapor deposition film between the lower second inorganic insulating film 36 and the upper second inorganic insulating film 38, and then ashing the organic vapor deposition film to cover foreign matters with the organic vapor deposition film. According to such a configuration of the sealing film, even if a foreign matter is present on the display region, the sealing performance can be ensured by the upper second inorganic insulating film, and the reliability can be improved.

In addition, in each of the embodiments described above, the organic EL display device is exemplified and described as the display device. The disclosure is, however, not limited to the organic EL display device and also applicable to any flexible display device. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:
1. A display device comprising:
a resin substrate;
a thin film transistor layer provided on the resin substrate and including a first inorganic insulating film;
a light-emitting element layer provided on the thin film transistor layer and including a plurality of light-emitting elements arranged corresponding to a plurality of subpixels of a display region; and
a sealing film provided on the light-emitting element layer to cover the plurality of light-emitting elements and including a second inorganic insulating film, wherein
a frame region is provided around the display region,
a non-display region is provided in an island shape within the display region,
a through hole penetrating in a thickness direction of the resin substrate is provided in the non-display region,
a first electrode, a functional layer, and a second electrode are sequentially layered in each of the plurality of light-emitting elements,
the functional layer includes a common functional layer provided in common to the plurality of subpixels,
an oxide semiconductor layer is provided in a frame-like shape along a peripheral edge of the through hole in the non-display region,
a first opening is provided in the first inorganic insulating film to surround the through hole in a plan view and to expose the oxide semiconductor layer in the non-display region,
the common functional layer is provided to extend from the display region to the non-display region,
a second opening is provided in a frame-like shape to surround the through hole in the plan view and to expose the oxide semiconductor layer in the common functional layer, and
the second inorganic insulating film is in contact with the oxide semiconductor layer via the second opening.
2. The display device according to claim 1,
wherein the oxide semiconductor layer is provided along a boundary between the display region and the non-display region.

3. The display device according to claim 1,
wherein a peripheral end portion of the oxide semiconductor layer on a side of the through hole is provided along a peripheral edge of the through hole.
4. The display device according to claim 3,
wherein the second opening is provided to extend to the peripheral edge of the through hole.
5. The display device according to claim 1,
wherein the second inorganic insulating film includes a lower second inorganic insulating film provided on a side of the resin substrate, and an upper second inorganic insulating film provided on a side opposite the resin substrate,
the sealing film further includes an organic insulating film provided between the lower second inorganic insulating film and the upper second inorganic insulating film, and
an external dam wall is provided in a frame-like shape in the frame region to surround the display region and to overlap with an outer peripheral end portion of the organic insulating film in the plan view.
6. The display device according to claim 5,
wherein an internal dam wall is provided in a frame-like shape in the non-display region to overlap with an inner peripheral end portion of the organic insulating film.
7. The display device according to claim 6,
wherein the internal dam wall is provided to surround the oxide semiconductor layer in the plan view.
8. The display device according to claim 6,
wherein a plurality of first photospacers and a plurality of second photospacers are provided in an island shape in the display region and the frame region, respectively, and
a plurality of third photospacers is provided in an island shape on a side of the display region of the internal dam wall.
9. The display device according to claim 1,
wherein a peripheral portion of the first inorganic insulating film on a side of the first opening is provided to cover an outer peripheral end portion of the oxide semiconductor layer.
10. The display device according to claim 1,
wherein a resin layer is provided between the first opening and the through hole in a frame-like shape to surround the through hole in the plan view.
11. The display device according to claim 10,
wherein the second inorganic insulating film is provided to surround the resin layer in the plan view.
12. The display device according to claim 10,
wherein a plurality of fourth photospacers is provided in an island shape on the resin layer.
13. The display device according to claim 10,
wherein a layered thick film portion is provided between the first opening and the through hole in a frame-like shape to surround the through hole in the plan view.
14. The display device according to claim 1,
wherein a third opening is provided in the second electrode, a peripheral end of the third opening coinciding with a peripheral end of the second opening.
15. The display device according to claim 1,
wherein the second inorganic insulating film is provided to surround the through hole in the plan view.
16. The display device according to claim 1,
wherein the thin film transistor layer further includes a plurality of thin film transistors provided corresponding to the plurality of subpixels, and the oxide semiconductor layer and semiconductor layers constituting the plurality of thin film transistors are formed into an identical layer using an identical material.

17. The display device according to claim 1, wherein the thin film transistor layer further includes a gate insulating film provided as the first inorganic insulating film, and a peripheral end portion of the oxide semiconductor layer is covered by the gate insulating film.

* * * * *